(12) United States Patent
Iguchi et al.

(10) Patent No.: US 6,214,708 B1
(45) Date of Patent: Apr. 10, 2001

(54) METHOD AND APPARATUS FOR DIFFUSING ZINC INTO GROUPS III-V COMPOUND SEMICONDUCTOR CRYSTALS

(75) Inventors: Yasuhiro Iguchi; Sosuke Sowa, both of Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/363,397

(22) Filed: Jul. 29, 1999

(30) Foreign Application Priority Data

Jul. 29, 1998 (JP) .................................................. 10-213954

(51) Int. Cl.[7] .................................................. H01L 21/38
(52) U.S. Cl. ........................................... 438/566; 438/569
(58) Field of Search .................................. 438/565, 566, 438/567, 568, 569

(56) References Cited

U.S. PATENT DOCUMENTS

| | | | |
|---|---|---|---|
| 4,280,858 | * | 7/1981 | Van Opdorp et al. ................ 438/569 |
| 4,592,793 | * | 6/1986 | Hovel et al. ........................... 438/567 |
| 4,742,022 | * | 5/1988 | Oren et al. ............................ 438/569 |

FOREIGN PATENT DOCUMENTS

| | | |
|---|---|---|
| 54-87469 | 7/1979 | (JP) . |
| 60-53018 | 3/1985 | (JP) . |
| 61-99327 | 5/1986 | (JP) . |
| 62-143421 | 6/1987 | (JP) . |
| 7-14791 | 1/1995 | (JP) . |

OTHER PUBLICATIONS

Tsuchiya et al., "High–Quality Zn–Diffused In P–Related Materials Fabricated by the OpenTube Technique", 7th International Conference of Indium Phosphide and Related Materials, pp. 664–666, 1995.

* cited by examiner

*Primary Examiner*—Chandra Chaudhari
(74) *Attorney, Agent, or Firm*—Smith, Gambrell & Russell, LLP

(57) ABSTRACT

An LPE (Liquid Phase Epitaxy) apparatus is diverted to a Zn-diffusion apparatus for diffusing Zn into III–V group compound semiconductor. The Zn-diffusion apparatus comprises a base plank extending in a direction, having a wafer-storing cavity for storing an object wafer and an exhaustion hole for exhaling gases, a slider having a frame and a cap plate for attaching to or detaching from the frame, the frame having serially aligning M rooms with an open bottom and a rack being separated from each other by (M−1) partition walls, a manipulating bar for sliding the slider upon the base plank forward or backward in the direction, a tube for enclosing the base plank and the slider and for being capable of being made vacuous, a heater surrounding the tube for heating the slider, each rack of the rooms being allocated with a Zn-diffusion material and a V element material (or a non-doped capping wafer) in turn for aligning the rooms into repetitions of a V element room and a diffusion room. The V element room or the capping wafer covers and protects the object wafer during the heating step. During the diffusion step, the diffusion room covers the object wafer for diffusing Zn into the wafer.

8 Claims, 10 Drawing Sheets

Step 1
exhausting a diffusion room into vacuum

Step 2
raising temperature

Step 3
diffusion

Step 4
cooling after diffusion

Fig.7 Step 1 exhausting a red phosphorus room into vacuum
(1)
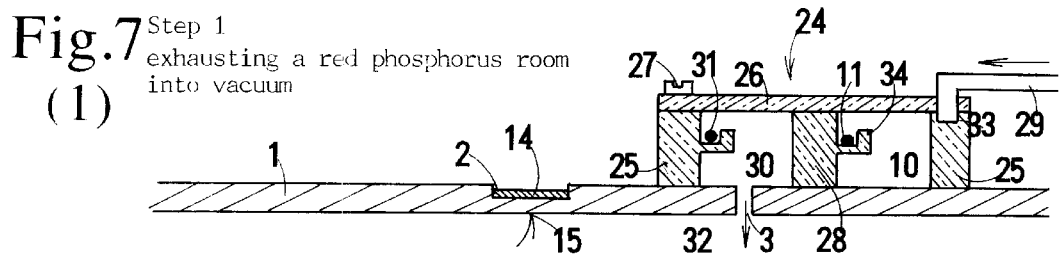
Fig.7 Step 2 exhausting a diffusion room into vacuum
(2)
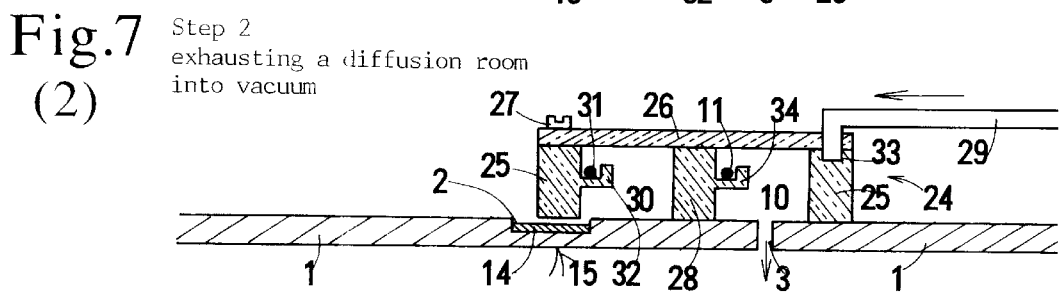
Fig.7 Step 3 raising temperature
(3)
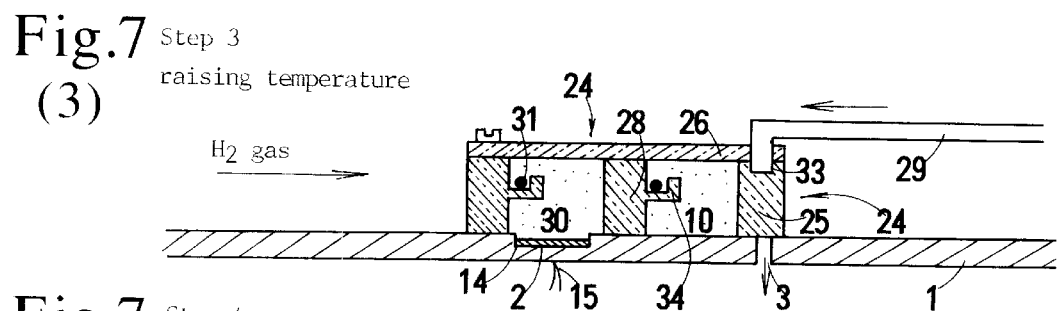
Fig.7 Step 4 diffusion
(4)
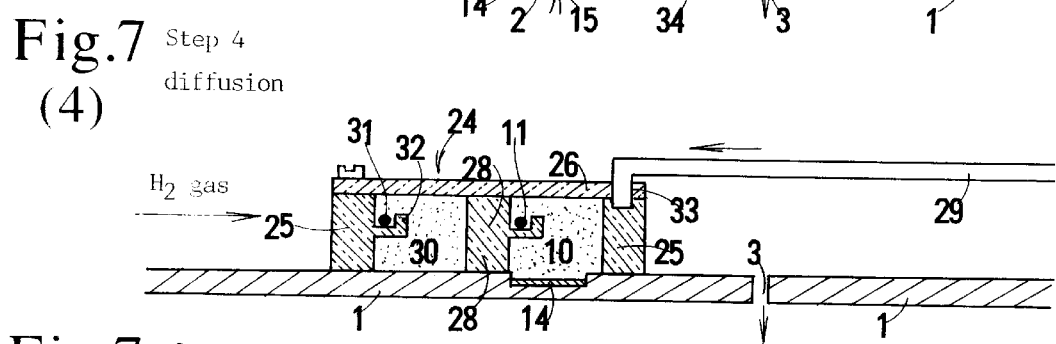
Fig.7 Step 5 cooling after diffusion
(5)
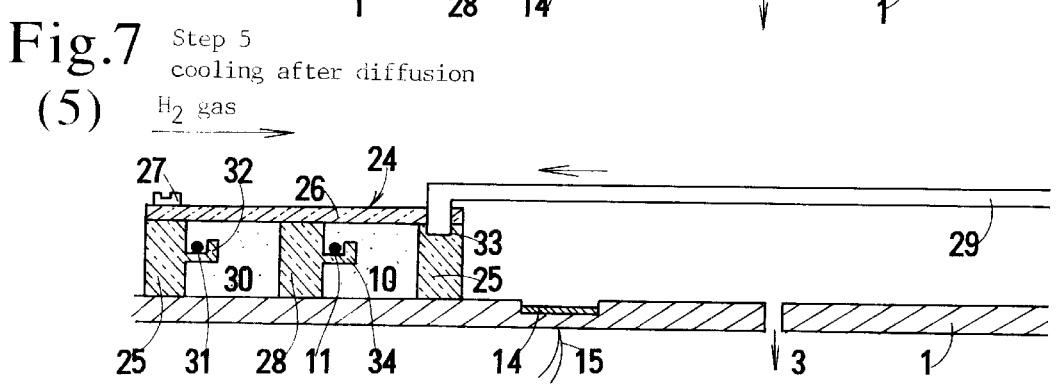

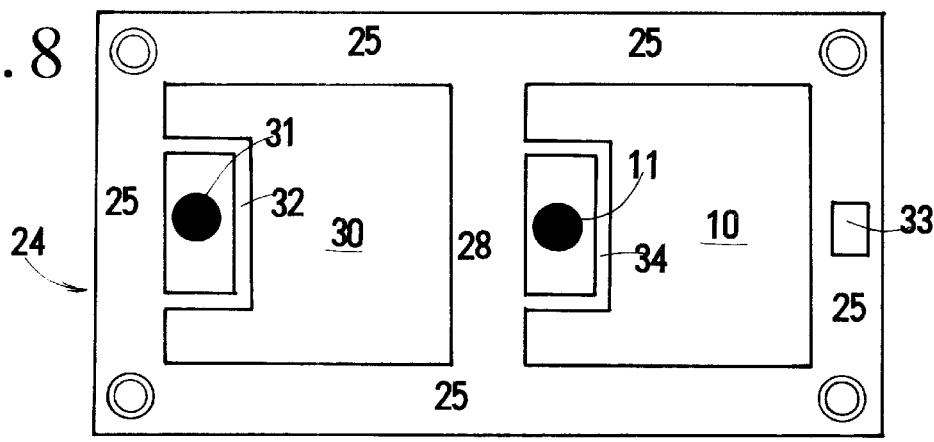
Fig. 8
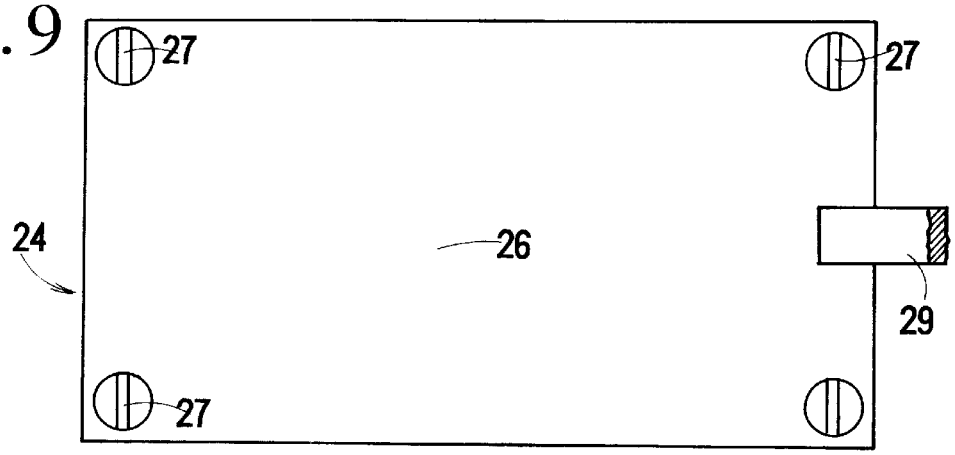
Fig. 9
Fig. 10
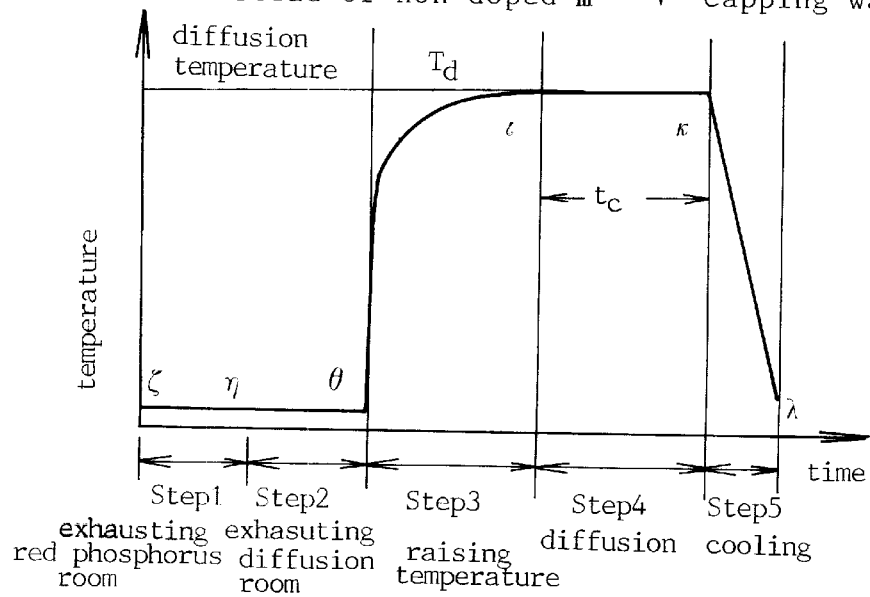

Temperature profile in the case of twice diffusion

Closed tube method

Closed tube method

METHOD AND APPARATUS FOR DIFFUSING ZINC INTO GROUPS III–V COMPOUND SEMICONDUCTOR CRYSTALS

BACKGROUND OF THE INVENTION

1. Field of the Invention

This invention relates to a method and an apparatus for diffusing zinc (Zn) into groups III–V compound semiconductors. The groups III–V compound semiconductor means a semiconductor of a pair of a group III element gallium (Ga), indium(In) or aluminum(Al), and a group V element arsenic(As), phosphorus(P) or antimony(Sb). Bulk single crystal wafers are available for GaAs, InP and GaP. GaAs wafers, InP wafers and GaP wafers are useful as substrates of laser diodes (LDs), light emitting diodes (LEDs), photodiodes (PDs) or other semiconductor devices. Though this invention can be applied to any III–V compound semiconductor wafers, explanation will be done by only citing GaAs and InP.

The III–V compound semiconductor wafers are inherently n-type in many cases. Fabrication of a pn-junction requires epitaxial growth of p-type thin films on the n-type wafer, ion implantation of a p-type impurity, or thermal diffusion of a p-type impurity into the n-type wafer. The epitaxial growth of the p-type films is improper for making localized p-regions through a mask. The ion implantation is not the most suitable, since it requires a large apparatus, a plenty of steps and annealing of the ion implanted wafer, which raise the cost of producing the pn-junction. The thermal diffusion is the most suitable way for making pn-junctions in an n-type wafer. Zinc (Zn) acts as a p-type impurity in GaAs or InP crystals. Magnesium (Mg) and cadmium (Cd) are also p-type impurities in GaAs or InP, but Zn is the most feasible p-impurity for InP or GaAs. Zn-diffusion is one of the most important techniques of fabricating LEDs, LDs, PDs and other semiconductor devices having the group III–V semiconductor substrates. The purpose of the Zn-diffusion is to make localized p-regions on a crystal by diffusion.

Here, the crystal includes substrate crystals and film crystals grown on substrate crystals. A purpose of the present invention is to provide a new Zn-diffusion method and apparatus applicable to a wide wafer. Another purpose of the present invention is to provide a Zn-diffusion method and apparatus of high controllability. A further purpose of the present invention is to provide a Zn-diffusion method and apparatus immune from the use of poisonous materials.

This invention is a version of vapor phase diffusion methods but is different from conventional vapor phase diffusion methods. This invention is rather akin to liquid phase epitaxy (LPE). This invention rather diverts the manner and the device from the liquid phase epitaxy to the Zn-diffusion. Though this invention resembles the liquid phase epitaxy, this invention is essentially a vapor phase diffusion of Zn. Instead of material liquid, a vapor of Zn is filled in a sliding jig. This invention is not epitaxy but diffusion. This invention must be clearly discriminated from the liquid phase epitaxy.

This application claims the priority of Japanese Patent Application No.10-213954(10-213954) filed on Jul. 29, 1998 which is incorporated herein by reference.

2. Description of Prior Art

Impurity diffusion is classified into two categories of vapor phase diffusion and solid phase diffusion by the distinction whether the impurity is supplied from solid phase or vapor phase. There is no concept of "liquid phase diffusion". The solid phase diffusion is a new technology recently proposed by the present Inventors for the first time (Japanese Patent Application No.5-177233, Japanese Patent Laying Open No.7-14791). The solid phase diffusion method has steps of growing a Zn-containing InGaAsP film epitaxially on an n-InP crystal substrate and diffusing Zn from the InGaAsP film into the InP substrate by heat. Since the object InP is protected by the InGaAsP film, P atoms do not escape from the bottom InP substrate in spite of heating in the solid phase diffusion. However, an excess number of steps have been prohibiting the practical use of the solid phase diffusion.

The Zn-diffusion is still actually done exclusively by vapor phase diffusion. The vapor phase diffusion is further classified into two methods. One of the vapor phase diffusion methods is a closed tube method. The other is an open tube method. Both two methods are well known. But only the closed tube method is put into practice on a large scale in the semiconductor industry at present. The open tube method is poorly employed on a small scale in some laboratories, because the open tube method is still suffering from unsolved difficulties. Two methods are explained in detail for clarifying the present state of the art of impurity diffusion.

[A. Closed tube method]

FIG. 14 shows a closed tube method for diffusing Zn into a group III–V semiconductor wafer. A long quartz tube 61 having an open end and a closed end is prepared. An InP wafer (or GaAs wafer) 62 is put on an inner spot near an end 60 of the quartz tube 61. A diffusion source 66 is put on an inner point near the other end 65 of the quartz tube 61. The quartz tube 61 is vacuumed and the open end is sealed by an oxygen-hydrogen flame burner. Sometimes the quartz tube 61 necks in a part 63 containing the solid diffusion source 66. The Zn diffusion source 66 is either a sublimable compound of Zn and As or a sublimable compound of Zn and P. For example, zinc phosphide ($ZnP_2$), zinc arsenide ($ZnAs_2$) or so is selected as a material of the Zn-diffusion source, because they satisfy the conditions of inclusion of Zn, sublimability from solid phase to vapor phase and immunity from foreign materials except Zn and the substrate material. This method is called a closed tube method, because the quartz tube is fully closed.

The sealed quartz tube 61 is put into a horizontal furnace having heaters 67 and 68. The furnace heaters 67 and 68 heat the whole of the quartz tube 61 and maintain the Zn-diffusion source 66 at a higher temperature than the wafer 62. The Zn-diffusion source 66 sublimes into vapor at the higher temperature. The vapor flies in the quartz tube to the wafer 62 of GaAs or InP and adheres to the wafer at the lower temperature. The Zn atoms diffuse deeply in the wafer by heat. The diffusion depth in the wafer can be controlled by the temperature and the time. After the determined time has passed, the temperature of the furnace is reduced. When the furnace is cooled to a pertinent temperature, the quartz tube 61 is pulled out of the furnace. The object GaAs wafer (or InP wafer) is taken out by breaking the quartz tube 61. The wafer is provided with pn-junctions by the Zn-diffusion.

FIG. 15 shows an improvement of the closed tube method. A long quartz tube 70 is prepared. A diffusion source 76 is put in at an end 75 of the quartz tube 70. A GaAs wafer (or an InP wafer) 74 is placed in a half-closed short tube 73. The half-closed tube 73 is put in at a middle of the quartz tube 70. A vacuum is formed in the quartz tube 70 and the tube end is sealed by the oxygen-hydrogen flame burner. The closed tube is inserted into a furnace having heaters 79, 80 and 82. The diffusion source 76 is heated to the highest temperature by the heater 79 for subliming the source material. The middle part of the tube is heated at the lowest temperature by the heater 80 for converting the diffusion material vapor into powder and once depositing the powder 78 on the inner wall. Then, the powder 78 is heated for flying to the GaAs wafer 74 for depositing on the wafer. There are some new proposals of the close tube methods other than the method of FIG. 15.

Why the tube must be sealed in the closed tube method? The sealing is required for the necessity of controlling the vapor pressure of the group V element (As or P). The closed space enables the dissolving speed of the diffusion source to uniquely determine the vapor pressure of the group V element. The dissolving speed is determined only by the temperature T of the diffusion source. Namely, in the closed tube, the vapor pressure is controlled only by the temperature T of the diffusion source. Maintaining the balance between the dissolution and the absorption of the group V element on the wafer surface, the close tube method carries the Zn compound in vapor phase from the diffusion source to the wafer, deposits the Zn atoms on the wafer and diffuses the Zn atoms deeply into the wafer.

The time and the temperature determine the depth and the concentration of diffusion. Only the closed tube method among various diffusion methods is practically used on a large scale in the semiconductor industry. The closed tube method has many advantages. The wafers are immune from contamination, because Zn is diffused in a closed space separated from the external environments. A great amount of gas is unnecessary. The wafers are not oxidized. The diffusion is stable. The reliability of diffusion is high in the case of deep diffusion. The closed tube method is a matured technique having a long, rich history. Since it is already an old, ripened technique, it is difficult to cite an original document which describes the typical closed tube method. Instead, some proposals for improvements will be explained now.

① Japanese Patent Laying Open No.60-53018,"method of diffusing impurities into a compound semiconductor" suggested a new way of vapor phase diffusion of zinc (Zn) into InP. Pointing out a problem of prior diffusion of an excess diffusion speed caused by sealing only an InP wafer and a diffusion source of $ZnP_2$ or $Zn_3P_2$, ① proposed an addition of a solid phosphorus (P) in the close tube for decreasing the diffusion speed. When the closed quartz tube is heated, the P-vapor pressure is raised by the sublimation of the newly added P solid in the closed tube. The Zn-vapor pressure is suppressed by the P-vapor pressure, since the total pressure is restricted by the temperature. The addition of the P-vapor pressure reduces the diffusion speed through the decrement of the Zn-vapor pressure. The solid P plays the role of retarding the diffusion of Zn.

Why must the closed tube method cut down the diffusion speed? Would the high speed diffusion bring about high throughput? It is, however, wrong. Large heat capacity accompanies the quartz closed tube owing a large length and a big thickness. It takes about 15 minutes to heat the quartz tube up to a temperature between 500° C. and 600° C. in the furnace. But the time of diffusion for making a 2 μm deep p-region is only 10 minutes due to the rapid diffusion. It takes several tens of minutes to cool the furnace for decreasing the temperature to room temperature. Heating and cooling of the whole of the quartz tube require a long time due to the large length and the big thickness.

The large heat capacity allows the quartz tube to change the temperature moderately and continually but forbids the tube from varying temperature rapidly. The sublimation of the diffusion source and the Zn-diffusion start even at the step of rising temperature due to the slow change of temperature. The diffusion still continues even at the step of cooling. The diffusion also occurs at extra steps other than the diffusion step. Since the closed tube method controls the diffusion only by temperature, it is impossible to control the start and the end of the diffusion exactly. Since heating and cooling require a longer time than diffusion, the depth of diffusion cannot be correctly determined. There is another problem of the contamination of the wafer by the Zn, because condensed Zn comes to adhering to the wafer surface at the step of cooling. For overcoming these drawbacks, ① tried to suppress the extra diffusion accompanying the heating step and the cooling step by supplying the P solid in the quartz tube, raising the P-vapor pressure and decreasing the Zn-vapor pressure.

[B. Open tube method]

A quartz tube having openings at both ends is prepared. The open tube method diffuses Zn into an InP wafer or a GaAs wafer by supplying the InP wafer (or GaAs wafer) into the quartz tube, heating the tube to a pertinent temperature, supplying a Zn-containing metallorganic gas and a As- or P-containing gas, for example, arsine ($AsH_3$) or phosphine ($PH_3$) into the open quartz tube. The Zn-containing metallorganic gas is prepared from a metallorganic compound having Zn which is liquid at room temperature, for example, dimethyl zinc ($Zn(CH_3)_2$). The Zn-containing metallorganic gas is made by bubbling the metallorganic compound with hydrogen gas. The Zn-containing gas is introduced into the quartz tube from an opening end and becomes in contact with the heated GaAs (or InP) wafer. The metallorganic gas (e.g.,dimethyl zinc) is dissociated by heat into zinc atoms and hydrocarbons. Zn atoms are adsorbed on the surface of the wafer. Zn atoms cover the surface of the wafer. High temperature gives the wafer a high diffusion coefficient. Zn atoms diffuse from the surface to the inner part along with the inclination of the Zn-concentration.

If the wafer were to be bluntly heated in vacuum, the group V atoms would escape from the surface of the III–V wafer owing to the high dissociation pressure at a high temperature. The open tube method introduces $PH_3$ gas or $AsH_3$ gas for heightening the vapor pressure of the group V element in order to forbid the group V atoms from dissociating out of the surface. The high pressure of the group V gas balances the dissociation with the adsorption of the group V atoms on the surface of the wafer. The balance of the open tube method is a dynamic balance in which the flowing gas ($PH_3$ or $AsH_3$) protects the wafer from dissociation in stead of perfect equilibrium by the static gas. The open tube method is inferior to the closed tube method in the vapor pressure balance. Since the tube is not sealed, the open tube method, however, can treat far larger wafers than the closed tube method. Possibility of processing a large sized wafer is the most conspicuous feature of the open tube method. Another advantage is the sparing of quartz tubes. Someone considers that the open tube method may excel in controllability, because the gas flows are ruled by valve operations. The open tube method, however, has not been practiced on a large scale in factories of the semiconductor industry yet, but has been adopted only for the purpose of experiments in some universities. For example, ② T. Tsuchiya, T. Taniwatari, T. Haga, T. Kawano, "High-quality Zn-diffused InP-related materials fabricated by the open-tube technique", 7th International Conference of Indium Phosphide and Related Materials p664 (1995, Sapporo) reported a Zn-diffusion by supplying a mixture gas of hydrogen ($H_2$), dimethyl-Zn, phosphine ($PH_3$) to an InGaAsP/InP epitaxial wafer in an MOCVD apparatus. Instead of preparing an inherent open tube diffusion apparatus, the MOCVD apparatus was diverted to an open tube method for diffusion. Since the open tube method requires only a heater and an enclosed space which allow gases to flow, the MOCVD apparatus can be a substitute for the quartz tube in the open tube method. Temporary diversion of the MOCVD apparatus on a small scale can be allowed. However, the MOCVD is an apparatus not for diffusion but for epitaxy. Such a high cost diversion would be forbidden on a large, industrial scale.

③ Japanese Patent Laying Open No.62-143421 "method and apparatus for diffusing an impurity" proposed an improvement of the open tube method. It denied the closed tube method for the reason that the diffusion starts midway of the step of rising temperature. FIG. 16 shows the proposed improvement having a horizontal quartz tube 83 with inlets 85 and 86, and an outlet 87. An InP wafer 84 is put at a spot near the outlet 87 within the quartz tube 83. A Zn-source 88 ($Zn_2P$) is laid at another spot near the inlet 86 in the quartz tube 83. An inactive gas is supplied into the tube 83 via the middle inlet 85. The flow of the inactive gas can separate the InP wafer 84 from the Zn-source 88. During the steps of rising temperature (heating step) and decreasing temperature (cooling step), the InP wafer 84 is effectively separated from the Zn-source 88 by blowing the inactive gas into the tube 83 from the middle inlet 85. During the step of diffusion, the flow of the inactive gas is stopped and hydrogen gas is supplied into the tube 83 from the end inlet 86. The hydrogen gas carries the vapor including Zn from the Zn-source 88 to the InP wafer 84. The Zn atoms are adsorbed on the surface of the wafer 84. The high temperature forces the Zn atoms to diffuse into the InP crystal. Operation bars penetrate into the tube through the side valves 89 and 90 for conveying the wafer 84 and the diffusion source 88. The swift change of the gases enables the open tube apparatus to forbid the diffusion from occurring during the cooling step and the heating step. The advocates assert that the open tube method can control exactly the depth of diffusion through the timely control of the gas flow.

The closed tube method is endowed with strong points of controllability of the group V gas pressure, saving of material gases, immunity from contamination and practical achievements. Despite many proposals, only the closed tube method is a practical Zn-diffusion method which has been widely carried out on a large scale in the semiconductor industry. The closed tube method, however, is suffering from a drawback of the difficulty of treating large-sized wafers. Since the closed tube method inserts an object wafer into a quartz tube (ampoule), the quartz tube having an inner diameter larger than the outer diameter of the object wafer should be employed. Not automated manipulators but skilled workers still do all the diffusion steps of inserting a wafer, putting an impurity source in a transparent quartz tube, making the tube vacuous and sealing an open end of the quartz tube by a oxygen-hydrogen flame burner. The formidable difficulty forces the experienced technician to handle the sealing step, excluding the possibility of the automatic sealing by a machine. The high melting point of quartz compels the technician to use the oxygen-hydrogen burner. The sealing operation includes the steps of evacuating the tube by a vacuum pump, softening a part of the quartz tube by the burner flame, narrowing the softened part, shutting the tube at the narrowing part, separating the other part of the quartz tube which is still evacuated by the vacuum pump and rounding the separated end of the part containing the wafer and the diffusion source by the burner. All the steps are done by manual operation of the skilled technician.

An increase of the diameter of the quartz tube raises the difficulty of the vacuum sealing of the quartz tube. One-inch diameter InP wafers have been used so far for making LEDs, LDs, PDs or other devices. But two-inch wafers will be employed for making the devices in near future for enhancing the throughput of the wafer process. If a two-inch diameter InP wafer should be inserted into a 3 mm-thick quartz tube, the outer diameter of the quartz tube would be at least 56 mm. It is extremely difficult even for an expert to seal such a wide quartz tube having a diameter of at least 56 mm. The vacuum sealing of the wide quartz tube requires an exquisite skill of an experienced technician.

The closed tube method has another weak point of the necessity of breaking the transparent, expensive quartz tube for taking the treated wafer out. The broken quartz tube cannot be reused. The broken parts of the expensive quartz tube must be thrown into a garbage pit. It is a waste of expensive natural resources. Further, since the quartz tube is broken down, the fragments are spattered. Some of the fragments adhere to the wafer. Further, the spattered fragments sometimes hurt the wafer.

There is a further drawback in the current closed tube method. It is poor controllability, since the diffusion is controlled only by the temperature. The poor controllability submits the unexpected diffusion occurring even during the (heating) step of rising temperature of the quartz tube. In addition, the undesirable diffusion also takes place even during the (cooling) step of decreasing the temperature. It is difficult to repeat the same profile of temperature change of the heating step, the diffusing step and the cooling step many times. Since the temperature profiles fluctuate every cycle of processes. The poor controllability leads to poor reproductivity of the diffusion depth. The diffusion depths disperse at random, in particular, in the case of shallow diffusion. Another difficulty is undesirable deposition of Zn atoms on the wafer during the cooling step. The closed tube method, therefore, is suffering from the problem of the poor controllability and the problem of the technical difficulty in the case of treating large-sized wafers. A desired diffusion method would be excellent in the controllability of diffusion and the applicability to larger wafers.

On the contrary, the open tube method is more suitable for treating large-sized wafers than the closed tube method. A larger wafer may be treated only by replacing the quartz tube by a larger tube. Since the open tube method does not seal the ends of the reaction tube, this method is immune from the technical difficulty of sealing the quartz tube. The open tube method, however, is plagued by other difficulties. The vapor pressure of the group V gas is unstable, because the group V gas and the Zn-containing gas flow in the tube. The instability of the group V gas may invite the dissociation of the V element atoms from the wafer surface. The open tube method has a more serious drawback. A great amount of the V element gas is supplied into the tube for maintaining the V gas pressure. The V element gas, for example, arsine ($AsH_3$) or phosphine ($PH_3$), is a strong poison. Protection of the environments would require a large-scaled depollution equipment of the exhaustion gas for the open tube method. The open tube method needs a highly expensive, large apparatus on an industrial scale. Thus, the semiconductor industry has not yet employed the well-known open tube method as Zn-diffusion technology.

SUMMARY OF THE INVENTION

One purpose of the present invention is to provide a Zn-diffusion method and apparatus enabling Zn to diffuse into large InP or GaAs wafers. Another purpose of the present invention is to provide an inexpensive Zn-diffusion method and apparatus without large scaled equipment. A further purpose of the present invention is to provide a Zn-diffusion method and apparatus which forbid the extra diffusion during the heating step and the cooling step. A further purpose of the present invention is to provide a Zn-diffusion method enabling to control exactly the timing of the beginning or the finishing of the Zn-diffusion by pertinent ways other than controlling the temperature. A further purpose of the present invention is to provide a Zn-diffusion method and apparatus enabling to control the density of group V element vacancies. A further purpose of the present invention is to provide a Zn-diffusion method and apparatus immune from the use of poisonous gases.

The diffusion method of the invention includes the steps of preparing a horizontal, long base plank having an exhaustion hole and a wafer-storing cavity, inserting a group III–V compound sample wafer into the cavity of the base plank, preparing a slider consisting of a frame with serially aligning M rooms with an open bottom and a rack being separated from each other by (M−1) partition walls, a non-doped capping wafer affixed at a front end of the frame and a cap plate for covering a top of the frame, taking the cap plate off the top of the slider, putting one of a Zn-diffusion source and a V element source turn by turn on each rack of the serially-aligning rooms, fixing the cap plate on the top of the frame for covering the open top of the slider, laying the slider on the base plank, affixing a manipulating bar to the slider, putting the base plank into a tube, making an inner space of the tube vacuous, carrying the slider by the manipulating bar at spots where each room lies in turn just above the exhaustion hole for evacuating each room through the exhaustion hole, carrying the slider by the manipulating bar to a spot for covering the sample wafer with the capping wafer of the slider, inserting the tube into a furnace with heaters, heating the base plank, the sample wafer and the slider, moving the slider at a spot for covering the sample wafer with the room having the diffusion source when the temperature attains to a pertinent temperature for diffusion, diffusing the Zn atoms into the sample wafer for a determined time at a pertinent temperature in the diffusion source room as a first diffusion process, moving the slider to a spot for covering the sample wafer with the room having the V element source, changing the temperature of the sample wafer to a temperature pertinent to following diffusion by regulating power of the heaters, moving the slider to a spot for covering the sample wafer with the following room having the diffusion source, diffusing the Zn atoms into the sample wafer for a determined time at a pertinent temperature in the diffusion source room as a second diffusion process, repeating necessary cycles of the steps of changing temperature and the steps of the Zn-diffusion, and finally moving the slider at a spot away from the sample wafer for cooling the sample wafer in a state separating from the diffusion room of the slider.

This invention uses a slider for diffusion of Zn unlike the prior closed tube method or the open tube method. The slider has a frame and a cap plate. The frame has an outer walls and inner partition walls. The frame contains M rooms of an open bottom and an open top separating by the (M−1) partition walls. The cap plate covers the open tops of the rooms of the frame. Each room has a rack on a side wall for holding a Zn-diffusion source or a V element source. When the slider is heated in a closed state, the rooms are filled with the vapor of the diffusion source or the vapor of the V element. Optionally, a non-doped capping wafer accompanies the slider at a front end. The slider is put upon a long, horizontal, flat base plank. The slider is equipped with a manipulating bar for sliding the slider in a longitudinal direction on the base plank.

The base plank has a cavity for storing a sample wafer to be doped with Zn and an exhaustion hole. The base plank is inserted into a tube, e.g., quartz tube, which can be made vacuous by a vacuum pump. Once the gas is evacuated out of the tube and hydrogen gas is introduced into the tube as atmosphere gas. Hydrogen gas accelerates the heating and the cooling of the tube through reinforcing the convection and the heat conduction. The tube is loaded into a preheated furnace having heaters. The heaters heat the base plank, the slider, the diffusion sources and the V element sources. The diffusion source room or the V element room in turn occupies at a spot just above the sample wafer by displacing the slider upon the base plank by the manipulating bar. When the Velement room having the V element gas occupies the wafer spot, the wafer is heated to a suitable temperature. When the wafer is heated to the temperature, the slider should be moved for coinciding the diffusion room having the Zn-diffusion source with the wafer spot for starting the diffusion.

In the diffusion room, Zn is diffused into the wafer in vapor phase, since the diffusion room in the slider is full of the diffusion source gas. When the vapor phase diffusion finishes, the diffusion room is separated from the sample wafer by displacing the slider by the manipulating bar. In the case of multiple diffusion for diffusing Zn to the same wafer more than once at different temperatures, the wafer should be held in the Velement room or under the capping wafer for changing the temperature of the wafer under the V element pressure. When the temperature attains to the determined temperature, the slider is moved for coinciding the sample wafer with the next diffusion room. Alternatively, the bottom of the V element room can be closed by a non-doped wafer. The sample wafer should be separated from the diffusion room of the slider during the step of cooling for preventing the extra diffusion.

The sample wafer is protected by the Velement room or the non-doped capping wafer during the step of changing the temperature of the wafer, for example, heating or cooling. M denotes the number of the rooms of the slider. M rooms have an opening bottom and an opening top. There are two kinds of sliders. One kind has a capping wafer either in front of or at the back of the frame. The other kind has no capping wafer. The capping wafer plays a similar role to the V element room for protecting the wafer from losing the V element.

In the case of the non-capping wafer, the room number M is two or more than two (M≧2), since the slider must contain at least one V element room and at least one diffusion room. K-time diffusion requires K diffusion rooms and K V element rooms which align in turn. Thus, M=2K for the K-time diffusion. In addition, a cooling room having V element can accompany the slider. In the case, the slider includes (K+1) Velement rooms and K diffusion rooms.

In the case of the front capping wafer, the room number M is one or more than one (M≧1), since the front capping wafer plays a similar role of the V element room. K-time diffusion requires (K−1) V element rooms and K diffusion rooms. Then, M=2K−1 for the K-time diffusion. If a cooling room is additionally equipped, the room number is M=2K. Some of the V element rooms can be replaced by capping wafer, since the roles of them are similar.

There are several variations even for a determined time of diffusion. For example, a K time diffusion contains the following six Versions;

Version 1. A capping wafer+(2K−1) room slider

Version 2. 2K room slider

Version 3. A capping wafer+2K room slider

Version 4. (2K+1) room slider

Version 5. A capping wafer+(2K−1) room slider+a capping wafer

Version 6. 2K room slider+capping wafer

Versions 1,3 and 5 enclose an object wafer with a capping wafer during the heating process for preventing the V element from escaping. Versions 2, 4 and 6 enclose an object wafer with a V element room for preventing the V element from escaping. The difference relates to the rising temperature process (heating process).

The cooling step gives different versions. Versions 1 and 2 cool the wafer in hydrogen atmosphere in the tube, because the wafer is not protected at the cooling step. All the embodiments that will be explained later belong to Versions 1 or 2. Version 1 gives the slider an array of diffusion room+V element room+diffusion room+ . . . +diffusion room (M=2K−1). Version 2 gives the slider another array of V element room+diffusion room+ . . . +diffusion room+V element room+diffusion room (M=2K).

Versions 3 and 4 protect the object wafer by the last V element room during the cooling step for avoiding the dissociation of the V element. The slider of Version 3 has an array of diffusion room+V element room+diffusion room+ . . . +diffusion room+V element room (M=2K). The slider of Version 4 has an array of V element room+diffusion room+ . . . +diffusion room+V element room (M=2K+1).

Versions 5 and 6 protect the object wafer by the additional end capping wafer during the cooling step for avoiding the dissociation of the V element. The slider of Version 5 has an array of diffusion room+V element room+diffusion room+ . . . +diffusion room (M=2K−1). The slider of Version 6 has an array of V element room+diffusion room+ . . . +diffusion room (M=2K).

The base plank is a long smooth even plank allowing the slider to slide without friction but preventing vapor from leaking through the gap between the base plank and the slider. Evenness, flatness, refractory and lubricancy are essential to the base plank. The base plank can be made from, for example, carbon. Carbon excels in heat resistance and lubricancy. Sliding on carbon may yield carbon dust. Thus, the carbon should be coated with amorphous carbon (a-C) or silicon carbide (SiC). It is possible to fix a carbon capping plate upon a carbon frame with carbon screws.

The Zn diffusion material should be solid at room temperature and should sublime at high temperature without melting. The candidates of the diffusion material are $Zn_3P_2$, $ZnP_2$, $Zn_3P_2$+P(red phosphorus), $ZnP_2$+P(red phosphorus). The V element material is the V component of the object wafer. The V element material is P for an InP wafer and As for a GaAs wafer.

This invention has big advantages. Unlike the closed tube method, this invention allows Zn compounds to diffuse into large sized wafers. The large size brings about no difficulty in the present invention. This invention treats with large sized wafers by enlarging the diffusion rooms and the V element rooms in the slider. This invention can easily be applied to a wafer larger than 2 inch in diameter. This invention is superior to the closed tube method in the applicability to large sized wafers. Extra diffusion does not occur at the heating step and at the cooling step, since the wafer is separated from the diffusion source. The displacement of the slider gives desired diffusion density distribution to the wafer. This invention enhances the controllability of the dopant distribution in the direction of thickness. This invention is immune from the problem of dopant deposition on the wafer surface at the cooling step, since the wafer is isolated from the dopant(Zn compound). The inner space of the diffusion room is so small and narrow that this invention dispenses with a large volume of V element gas flow. A reduction of poisonous V element gas improves the safety. This invention is superior to the open tube method in the gas consumption, the freedom of the dopant deposition and the safety.

BRIEF DESCRIPTION OF THE DRAWINGS

FIG. 1(2) is a sectional view of Embodiment 1 at the step of heating the apparatus and an object wafer.

FIG. 1(3) is a sectional view of Embodiment 1 at the step of diffusing impurity into the object wafer.

FIG. 1(4) is a sectional view of Embodiment 1 at the step of cooling the apparatus.

FIG. 7(1) is a sectional view of Embodiment 2 of a slider having a diffusion room and a V-element room at the step of vacuuming the V-element room(red phosphorus room).

FIG. 7(2) is a sectional view of Embodiment 2 at the step of vacuuming the diffusion room.

FIG. 7(3) is a sectional view of Embodiment 2 at the step of heating the apparatus and an object wafer.

FIG. 7(4) is a sectional view of Embodiment 2 at the step of diffusing impurity into the object wafer.

FIG. 7(5) is a sectional view of Embodiment 2 at the step of cooling the apparatus.

FIG. 8 is a plan view of the slider of Embodiment 2 having the V-element room and the diffusion room in an open state without the cap.

FIG. 9 is a plan view of the slider of Embodiment 2 in a closed state with the cap.

FIG. 10 is a graph showing the time dependence on the temperature in Embodiment 2 having a V element room instead of the capping wafer.

DETAILED DESCRIPTION OF THE PREFERRED EMBODIMENTS

[Embodiment 1: single room type slider; rough capping wafer; single time diffusion]

Embodiment 1 relates to single time diffusion, employing a non-doped capping wafer with a rough surface. Embodiment 1 covers an object wafer in the cavity by the non-doped capping wafer for protecting the object wafer against the dissociation of V element during the heating step (rising temperature step), moves the slider above the object wafer when the wafer attains to the diffusion temperature Td, starts the Zn diffusion into the object wafer and separates the slider from the object wafer when the diffusion finishes for isolating the object wafer from the diffusion vapor atmosphere.

Figure 1:
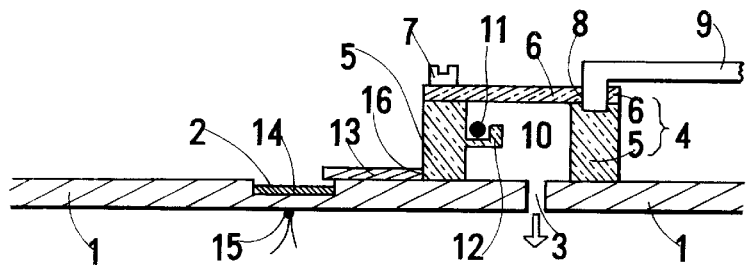
FIG. 1(1) is a sectional view of Embodiment 1 of a slider having a single diffusion room at the step of vacuuming the diffusion room.
Figure 1:
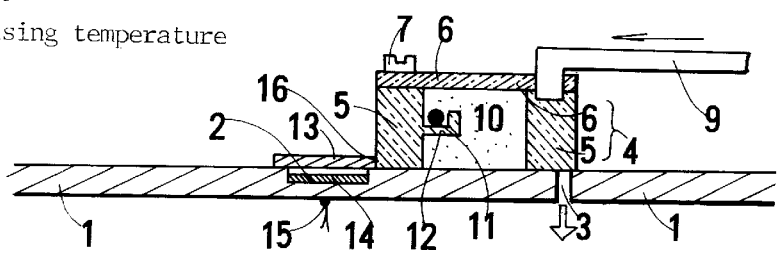
Figure 1:
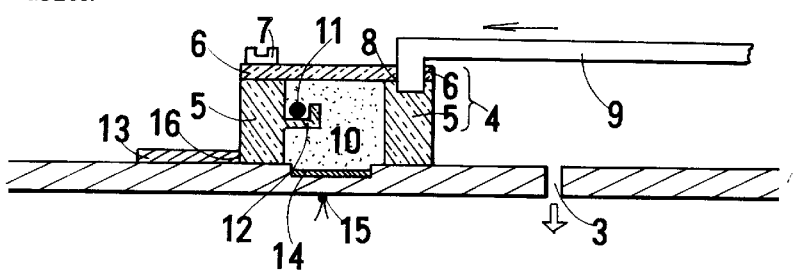
Figure 1:
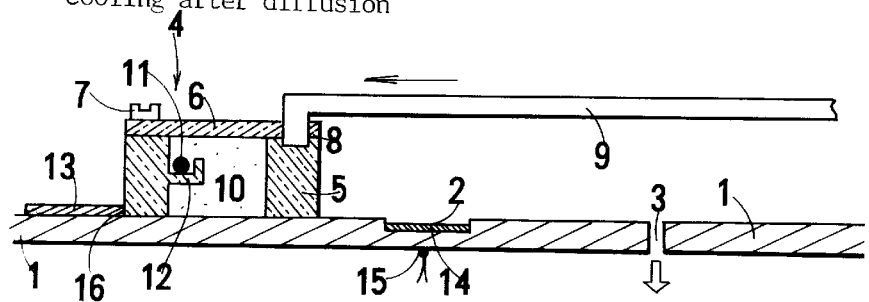
Figure 2:
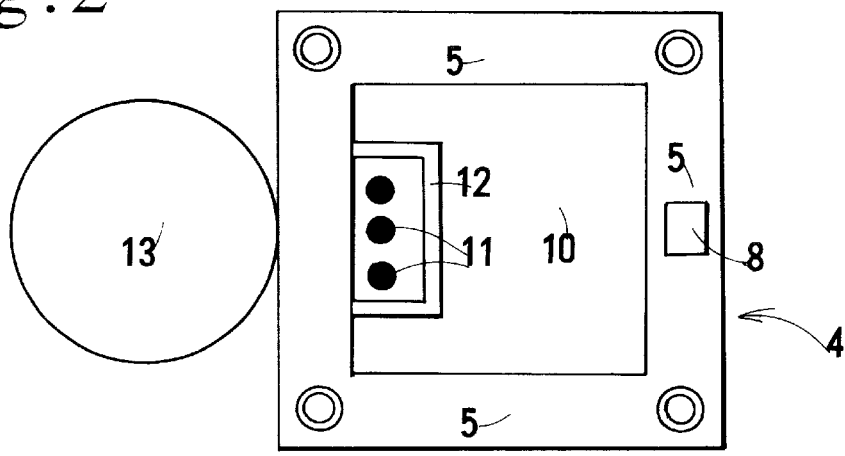
FIG. 2 is a plan view of the slider of Embodiment 1 in an open state without the cap.
Figure 3:
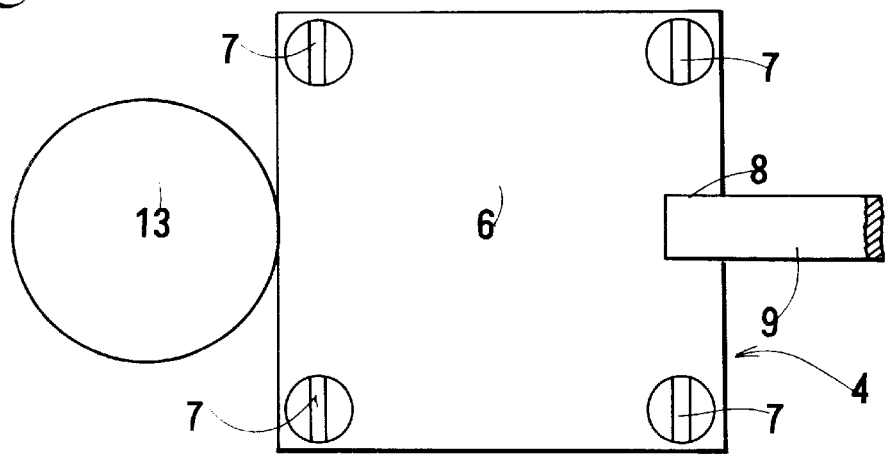
FIG. 3 is a plan view of the slider of Embodiment 1 in a closed state with the cap.

FIG. 1, FIG. 2 and FIG. 3 denote Embodiment 1. FIG. 1 shows the steps of the Zn diffusion of the present invention. FIG. 2 is a plan view of a frame and a capping wafer. FIG. 3 is a plan view of a slider and the capping wafer. This is a device for a single wafer. A double-sized slider for treating two wafers can be produced by enlarging the width twice in the lateral direction. Furthermore, a slider including m wafers can be made instead of the single wafer slider of FIG. 2 and FIG. 3. The pertinent size of the frame of the slider can be determined by considering the required throughput.

Figure 5:
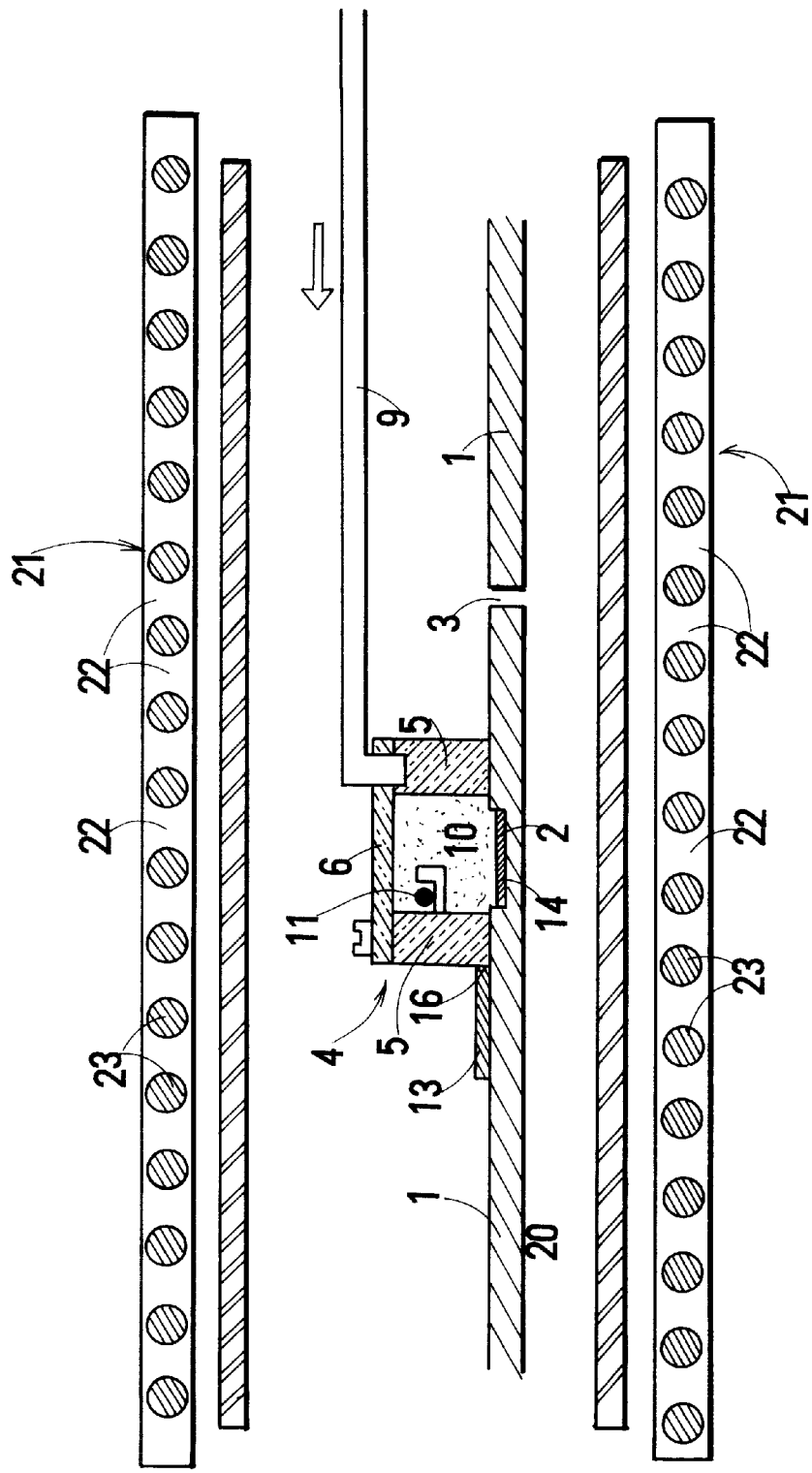
FIG. 5 is a sectional view of the slider, the base plank, the quartz tube and the reaction furnace of Embodiment 1.

The parts shown by FIG. 1 are contained in a reaction chamber, for example, a quartz tube 20, as shown in FIG. 5. The reaction chamber can be evacuated. A base plank 1 is a long smooth even carbon table elongating in a longitudinal direction. The base plank 1 is inserted into the reaction chamber. The carbon base plank 1 has a good resistance against chemicals and good sliding performance. Naked carbon may appear on the surface of the base plank 1. It is preferable to coat at least the upper surface of the base plank 1 by some hard material for preventing the base plank 1 from inducing carbon powder by friction. The base plank 1 may be coated with, for example, silicon carbide (SiC) or amorphous carbon (a-C). The base plank 1 can otherwise be made from refractory metal, for instance, tantalum (Ta), tungsten (W) or stainless steel. A shallow wafer-storing cavity 2 is perforated on the base plank 1 for maintaining an object wafer 14. The size of the cavity 2 is determined by the object wafer 14. An exhaustion hole 3 is pierced vertically in the base plank 1.

An important part is a slider 4. The slider 4 has a top wall and side walls with a bottom open. The slider 4 has a rectangular frame 5 and a capping plate 6. FIG. 2 shows only the frame 5. FIG. 3 denotes the slider 4 with the cap plate 6. In the example, the inner space within the slider 4 has a 30 mm width, a 30 mm length and a 20 mm height with a volume of 18 cm$^3$. The slider 4 is put on the base plank 1 with the open bottom down. When the open bottom coincides with the exhaustion hole 3, a vacuum is formed in the inner space of the slider 4 by absorbing gases from the exhaustion hole 3. The cap plate 6 is fixed upon the rectangular frame 5 by screws 7.

The open bottom of the frame 5 slides on the base plank 1, keeping a direct contact therewith. The smooth and flat bottom brings the slider 4 into tight contact with the base plank 1 without leak. The frame 5 is made from, e.g. carbon which allows exact processing within a tolerance of several microns. The side walls of the slider 4 have a thickness between 10 mm and 20 mm. The cap plate 6 can be made from carbon. Preferably, the carbon frame 5 and the cap plate 6 should be coated with SiC or a-C like the base plank 1.

A hole 8 is perforated on the cap plate 6 and the frame 5 for inserting an L-shaped end of a manipulating bar 9. The slider 4 is moved forward or backward by the manipulating bar 9 on the base plank 1. Conventional liquid phase epitaxy (LPE) is used to move a slider by a manipulating bar on a base plank. It is also analogy from the conventional LPE to make the slider from carbon. But in fact, the slider or the cap plate can be made from stainless steel or other metals.

The frame 5, the cap plate 6 and the base plank 1 form a diffusion room 10. The diffusion room 10 is a small, movable space. The movability of the slider 4 is an origin of the excellent controllability of the present invention. The diffusion room 10 has a rack 12 on the side wall for storing a diffusion material 11. The diffusion material depends upon the object wafer. In the case of an InP wafer, the diffusion material should be a compound of Zn and P, for example, $Zn_3P_2$ or $ZnP_2$. In the case of a GaAs wafer, the diffusion material should be a compound of Zn and As, for example, $Zn_3As_2$ or $ZnAs_2$. In general, the diffusion material should be a sublimable compound including Zn and the V element of the object wafer. The rack 12 sustains a solid diffusion material. When the diffusion room 10 is heated, the diffusion room 10 is full of the vapor of the material. The tight contact of the slider 4 on the base plank 1 prevents the vapor of the material from leaking outward.

The diffusion material 11 is loaded in the slider 4 by taking the cap plate 6 off the frame 5, supplying a solid diffusion material 11 on the rack 12, laying the cap plate 6 upon the frame 5, fixing the cap plate 6 on the frame 5 by the screws 7. Then, the L-end of the manipulating bar 9 is inserted into the hole 8.

The slider 4 has a non-doped capping wafer 13 at the front end. The non-doped capping wafer 13 has a rough surface facing to an object wafer for enhancing the function of suppressing dissociation of the V element of the object wafer. The capping wafer 13 moves together with the slider 4 on the base plank 1, since the capping wafer 13 is stuck to the slider 4. The material of the capping wafer 13 has the same material as the object wafer. An InP capping wafer should be employed for an InP object wafer. A GaAs object wafer requires a GaAs capping wafer. The capping wafer 13 plays the role of covering the object wafer 14 during the heating step for inhibiting the V element from escaping the object wafer 14. In general, III–V compound semiconductors, e.g., InP and GaAs, should be suppressed at high temperatures by V element vapor pressure, since the V element has a big dissociation pressure. When the object wafer 14 is heated in the cavity 2, the capping wafer is simultaneously heated on the base plank 1. The capping wafer 13 discharges the V element gas from the ragged surface for filling the narrow space within the cavity 2 with e.g., As-gas or P-gas. The capping wafer 13 suppresses the dissociation of the V element from the object wafer 14.

The capping wafer 13 should be a non-doped wafer. Otherwise impurities would be transferred from the capping wafer 13 to the object wafer 14. The surface facing the object wafer 14 is not polished but roughened. The roughed surface enhances the discharge of the V element gas from the capping wafer 14 by enlarging the effective area of the surface. The narrow space within the cavity 2 and the capping wafer 14 is occupied by the V element vapor. A tip of a thermocouple 15 is in contact with the base plank 1 beneath the object wafer 14.

Figure 4:
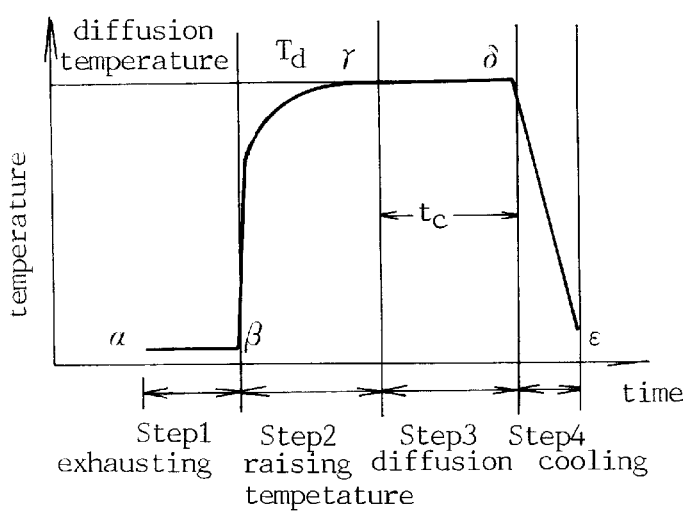
FIG. 4 is a graph of the time dependence on the temperature of the diffusion room in Embodiment 1.

The following steps shown in FIG. 1 will be done according to the temperature change of FIG. 4 for doping Zn into the object wafer.

[Preparatory steps]
(1) An object wafer 14, e.g., InP wafer or GaAs wafer, is put into the wafer-storing cavity 2 of the base plank 1.
(2) The quartz tube 20 is inserted into the pre-heated furnace.
(3) The slider 4 is pulled backward on the base plank 1 to a preparing point and the non-doped capping wafer 13 is affixed at the front of the slider.
(4) The screws 7 are taken out of the cap plate 6 and the slider 4. The slider 4 is opened by eliminating the cap plate 6. A diffusion material solid 11 is supplied on the rack 12. The diffusion material 11 is $Znp_2$, $Zn_3P_2$ in the case of an InP object wafer. The diffulsion material is $ZnAs_2$, $Zn_3As_2$ or so in the case of a GaAs object wafer.
(5) The cap plate 6 is put upon the frame 5. The cap plate is fixed to the frame 5 by turning on the screws 7. The L-end of the manipulating bar 9 is put into the hole 8 of the slider 4.
(6) The base plank 1 with the slider 4 is inserted into the quartz tube 20 (FIG. 5).

[Step 1 (forming a vacuum in the diffusion room of the slider]
(7) A vacuum is formed in the reaction tube 20 in the state of FIG. 1(1) by a vacuum pump. The outer space of the slider 4 is evacuated by the vacuum pump. The inner space of the slider 4 is also evacuated through the exhaustion hole 3 of the base plank 1. A desired vacuum of the same pressure is created in both the outer space and the inner space.
(8) The slider 4 is pushed forward by the manipulating bar 9 to a position where the diffusion room 10 deviates from the exhaustion hole 3 and the capping wafer 13 covers the object wafer 14 for isolating the inner space of the slider 4 from the outer space. After the tube is evacuated to a vacuum, hydrogen gas is introduced into the reaction tube for accelerating heat conduction or heat convection for facilitating heating and cooling. The temperature in the diffusion room is denoted by the line $\alpha\beta$ in FIG. 4.

[Step 2 (rising temperature step or heating step)]
(9) The base plank 1, the capping wafer 13 and the object wafer 14 are heated by the furnace at the heating step, where the temperature rises toward the diffusion temperature Td, as shown by the curve $\beta\gamma$ in FIG. 4. The capping wafer 13 discharges the V element gas from the ragged surface for preventing the object wafer 14 from losing the V element atoms at the heating step. The protection by the capping wafer 13 may allows weak occurrence of the V element vacancies. The heating step is shown in FIG. 1(2).
(10) The slider 4 is also heated at the heating step for inducing the diffusion material 11 to sublime and to fill the inner space of the slider 4. The vapor pressure of the V element material rises in the diffusion room 10. No diffusion occurs at the heating step, since the object wafer 14 is separated from the Zn vapor. The temperature of the wafer 14 is observed by the thermocouple 15.

[Step 3 (diffusion step)]
(11) When the temperature attains to the diffusion temperature Td (T=Td), the slider 4 is pushed forward by the manipulating bar 9 at a spot, where the diffusion room 10 lies above the wafer-storing cavity 2, as shown in FIG. 1(3). This state corresponds to the line $\gamma\delta$ on the temperature profile of FIG. 4. The diffusion room 10 of the slider 4 has been filled with dense Zn compound vapor. The Zn compound vapor comes into contact with the object wafer 14. Immediately, the Zn diffusion into the wafer 14 starts. Since the diffusion room 10 is narrow, there is no macroscopic flow of gas. The V element vapor is stable in the diffusion room 10. The desired diffusion depth determines the diffusion time tc.

[Step 4 (cooling step)]
(12) When the predetermined diffusion time has passed, the slider 4 is moved on the base plank 1 by the manipulating bar 9 for separating the slider 4 from the object wafer 14. The Zn diffusion stops at once.
(13) The wafer 14 is cooled in a state separated from the slider 4, as shown in FIG. 1(4). This step corresponds to the line $\delta\epsilon$ in FIG. 4.

FIG. 5 shows the section of the diffusion apparatus including the surroundings. The base plank 1, the slider 4 and the manipulating bar 9 are contained in the quartz tube 20. The quartz tube 20 is not a closed tube. The tube 20 can be evacuated from an end. The tube 20 allows the operation of the manipulating bar 9 from the outer space. The whole of the tube 20 is inserted into a furnace (heater) 21 The heater 21 consists of a coil resistor 23 and a refractory material 22 supporting the coil resistor 23. The furnace 21 is an ordinary electric heater which generates Joule's heat by the supply of electric current.

[Embodiment 2: two room type slider; V element room; single time diffusion]
Embodiment 2 aims at preventing the V element from dissociating out of the object wafer during the heating process more effectively than Embodiment 1. For the purpose, Embodiment 2 employs a V element room in the slider 4 instead of the non-doped capping wafer of Embodiment 1. The object wafer is enclosed with higher V element vapor pressure due to the V element room during the heating step than in Embodiment 1. The role of the newly introduced V element room is similar to the capping wafer. When the temperature is raised to Td, the slider is displaced to a spot where the diffusion room coincides with the object wafer for starting the Zn diffusion. When the Zn diffusion finishes, the slider is again displaced for separating the wafer from the Zn atmosphere. Embodiment 2 can suppress the dissociation of the V element by the high V element vapor pressure. Embodiment 2 is more effective for inhibiting the occurrence of V element vacancies in the object wafer.

FIG. 7 shows the steps of the Zn diffusion of Embodiment 2. FIG. 8 is a plan view of the frame of the slider of Embodiment 2. FIG. 9 is a plan view of the slider with the cap plate. A slider 24 has two rooms unlike Embodiment 1. A V element room 30 is newly furnished to the slider 24 instead of the capping wafer. The slider 24 has a frame 25 and a capping plate 26. The frame 25 has external walls and a partition 28 in the middle. The frame 25 is divided into the V element room 30 and a diffusion room 10. The rear diffusion room 10 has a rack 34 on the wall for keeping a diffusion material 11.

The front V element room 30 has a rack 32 on the wall for maintaining a V element solid 31, which is phosphorus (P) for an InP wafer or is arsenic (As) for a GaAs wafer. The two room type slider 24 covers the object wafer 14 with the V element room 30 during the heating step for suppressing the generation of V element vacancies. The steps of FIG. 7 are explained. FIG. 10 is the temperature profile of the steps measured by a thermocouple 15.

[Preparatory steps]
(1) An object wafer 14, e.g., an InP wafer or a GaAs wafer, is inserted into a wafer-storing cavity 2 of a base plank 1.
(2) The reaction tube is inserted into the furnace.
(3) The slider 24 is moved to a spot where the V element room 30 coincides with a exhaustion hole 3 of the base plank 1.
(4) Screws 27 are gotten off and the capping plate 26 is removed from the frame 25. A diffusion material 11 is supplied to the rack 34 of the rear diffusion room 10. The diffusion material 11 is $Znp_2$ or $Zn_3P_2$ for an InP wafer, or $ZnAs_2$ or $Zn_3As_2$ for a GaAs wafer. A V element material 31 is put on the rack 32 of the former V element room 30. The V element material is red phosphorus (P) for the InP wafer, or arsenic (As) for the GaAs wafer. The following describes an example of employing red phosphorus for an InP wafer as the V element material 31.

(5) The capping plate 26 is put upon the frame 25 and fixed to the frame 25 by the screws 27. The L-shaped end of a manipulating bar 29 is put into a hole 33 of the slider 24.

(6) The whole of the base plank 1 with the slider 24 is inserted into the quartz reaction tube 20 (FIG. 5).

[Step 1 (exhausting the V element room (red phosphorus room) into vacuum]

(7) The slider 24 stays at the spot where the red phosphorus (V element) room 30 lies above the exhaustion hole 3, as shown in FIG. 7(1). A vacuum is created in the reaction tube by a vacuum pump (not shown). The outside of the slider 24 is evacuated directly. The red phosphorus room 30 of the slider 24 is also evacuated through the exhaustion hole 3. This step corresponds with the temperature line $\zeta\eta$ (room temperature) in FIG. 10.

[Step 2 (exhausting the diffusion room)]

(8) The slider 24 is pushed forward by the manipulating bar 29 to a spot where the diffusion room 10 lies above the exhaustion hole 3, as shown in FIG. 7(2). A vacuum is created in the diffusion room 10 through the exhaustion hole 3. Thus, both the phosphorus room 30 and the diffusion room 10 are vacuous. Hydrogen gas is introduced into the reaction tube 20. The outer space is occupied by hydrogen gas. The temperature takes the line $\eta\theta$ (room temperature) in this step as shown in FIG. 10.

[Step 3 (heating step or rising temperature step)]

(9) When a vacuum is created in the diffusion room 10, the slider 24 is pushed forward to a spot where the V element room 30 covers the object wafer 14 which is shown by FIG. 7(3). This corresponds to the point $\theta$ in the temperature profile of FIG. 10.

(10) At the step 3 of rising temperature, the furnace overall heats the object wafer 14, the slider 24, the V element material 31 and the diffusion material 11, which is denoted by the curve $\theta\iota$. The dopant (Zn compound) material 11 is sublimed for making high Zn compound vapor pressure in the diffusion room 10. The V element material 31 is sublimed for creating high V element vapor pressure in they element room 30. The object wafer 14, which is protected by the high V element vapor pressure in the V element room, is immune from the dissociation of the V element out of the surface. As the temperature rises from $\theta$ to $\iota$, the V element (phosphorus here) vapor pressure in the V element room 30 and the Zn compound vapor in the diffusion room 10 pressure rise.

[Step 4 (diffusion step)]

(11) When the temperature T rises to Td, the slider 24 is moved forward by the manipulating bar 29 at a spot where the diffusion room 10 covers the wafer 14, as shown in FIG. 7(4). The dopant vapor pressure has risen enough high at Td in the diffusion room 10. The Zn vapor comes into contact to the wafer 14. The Zn diffusion starts immediately on the object wafer 14. The diffusion step corresponds to the line $\iota\kappa$ in FIG. 10. The diffusion time tc should be determined by the purpose of the diffusion.

[Step 5 (cooling step)]

(12) When the diffusion time tc has passed, the slider 24 is moved to a spot (FIG. 7(5)) for separating the diffusion room 10 from the cavity 2 by the manipulating bar 29. This corresponds to the point $\kappa$ in FIG. 10. The diffusion stops at once.

(13) The wafer 14 is cooled from Td to room temperature which is denoted by the line $\kappa\lambda$ in FIG. 10.

[Embodiment 3: three room type slider; twice diffusion]

Embodiment 3 aims at diffusing Zn twice into an object wafer on different conditions. The twice diffusion requires three rooms for the slider. The doping processes are different in the kind of the dopants or in the diffusion temperature. Two rooms of the three are diffusion rooms containing Zn compounds. The two diffusion rooms sandwich a V element room. The slider has the diffusion room, the V element room and the diffusion room in turn. An additional capping wafer protects an object wafer during the heating step. The V element room seals the object wafer in the intermediate step between the first (former) diffusion and the second (latter) diffusion. Embodiment 3 employs different means for inhibiting the object wafer from losing the V element. Twice diffusion is realized by Embodiment 3.

But this invention can also be applied to three-time-diffusion or four-time-diffusion which are different in conditions of e.g., different dopants, different times or different temperatures. In general, M-times of diffusion requires 2M rooms (M diffusion rooms and M V element rooms) or (2M−1) rooms (M diffusion rooms and (M−1) V element rooms with a capping wafer).

Figure 11:
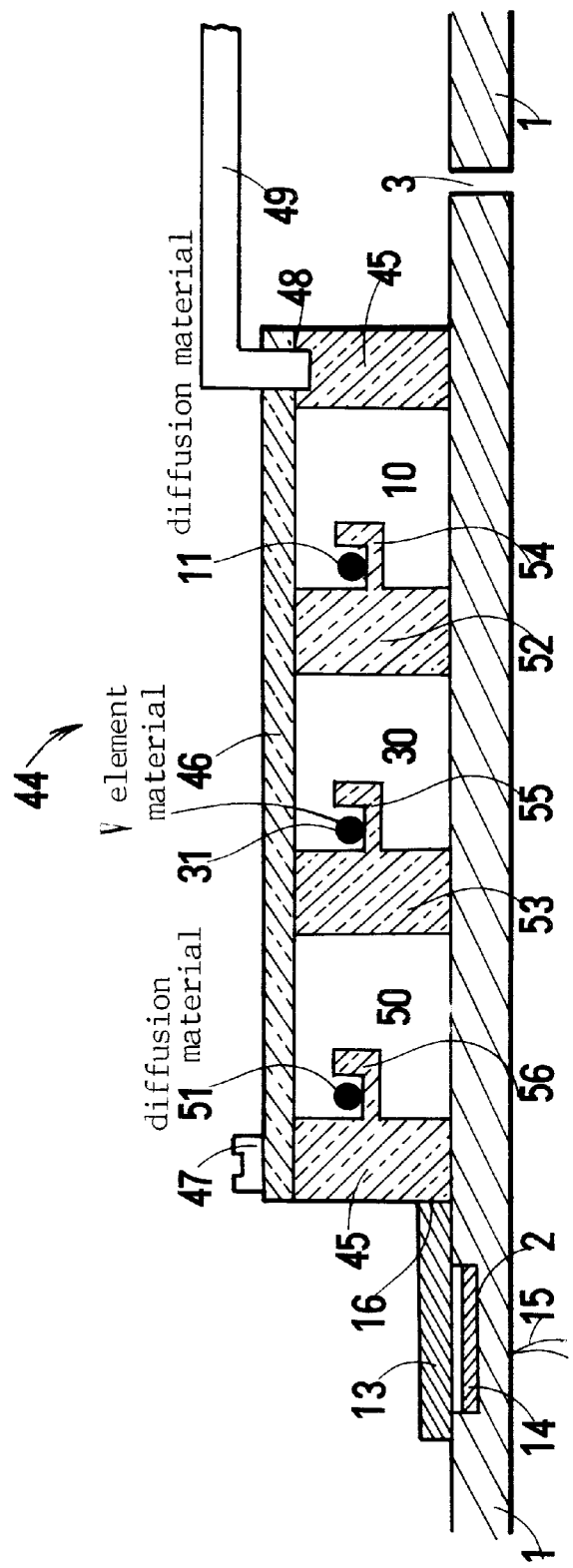
FIG. 11 is a section of a three-room slider for twice diffusion of Embodiment 3.
Figure 12:
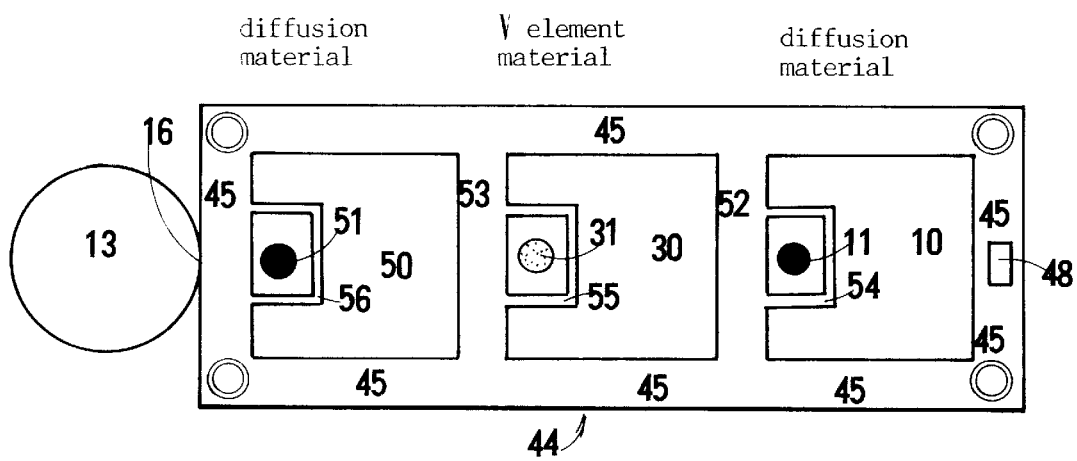
FIG. 12 is a plan view of the three-room slider without the cap for twice diffusion of Embodiment 3.
Figure 17:
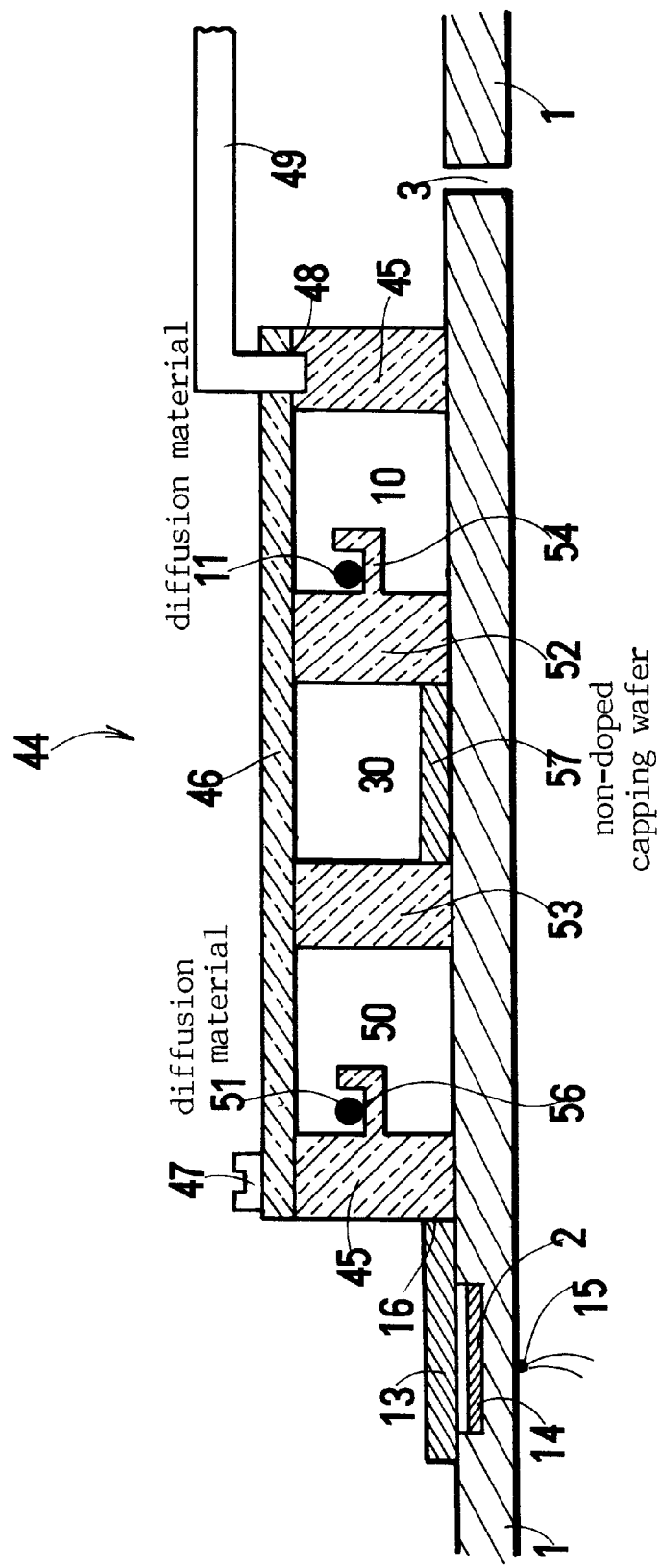
FIG. 17 is a section of a three-room slider for twice diffusion of Embodiment 3 which employs a capping wafer instead of the V element room.

FIG. 11 shows the sectional view of a slider of Embodiment 3. FIG. 12 is a plan view of the slider without the cap plate. The V element vapor of FIG. 11 can be replaced by a non-doped capping wafer. FIG. 17 shows a version having a bottom capping wafer 57 in the V element room 30. Detailed steps are not shown in figures, because the steps are obvious from FIG. 1 of Embodiment 1 and FIG. 7 of Embodiment 2. A slider 44 has three rooms formed by a frame 45 and a capping plate 46. The frame 45 has external walls and two partition walls 52 and 53. The three rooms are a diffusion room 50, a V element room 30 and a diffusion room 10 in this order. The capping plate 46 is fixed upon the frame 45 by screws 47. The rooms 50, 30 and 10 have open bottoms. The first diffusion room 50 has a rack 56 containing a first diffusion material 51. The V element room 30 has a rack 55 for storing a V element material 31. The second diffusion room 10 has a rack 54 for sustaining a second diffusion material 11. The slider 44 has an end hole 48 for fitting a manipulating bar 49. The manipulating bar 49 displaces the slider 44 in the longitudinal direction upon a base plank 1.

The slider 44 has a non-doped capping wafer 13 fixed at the front end. The non-doped capping wafer 13 covers the cavity 2 for suppressing the V element from escaping out of the surface of an object wafer 14 at the heating step. The capping wafer 13 can also be replaced by a V element room in the slider. In the variation, the slider would have four rooms.

Figure 13:
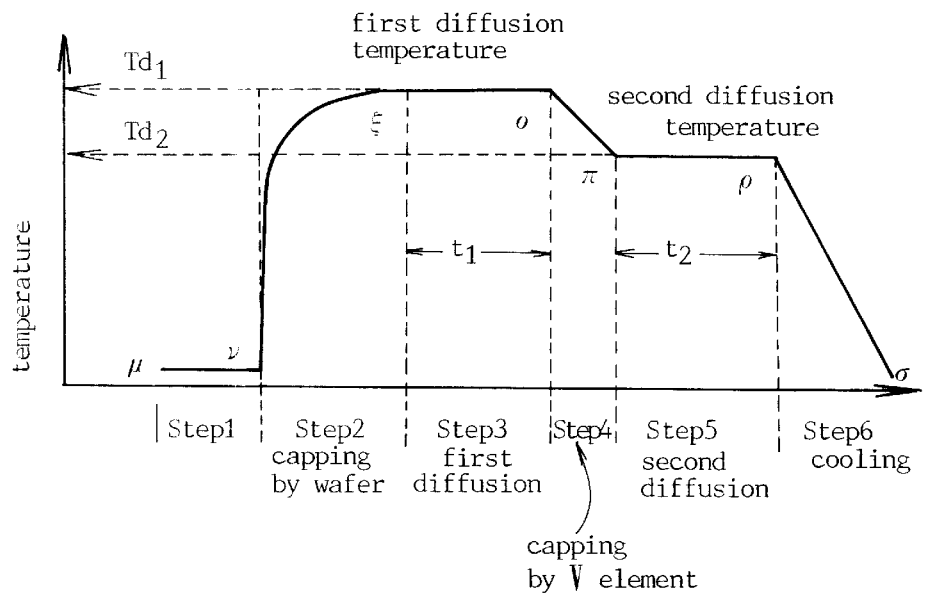
FIG. 13 is the time dependence of the temperature for twice diffusion of Embodiment 3.
Figure 14:
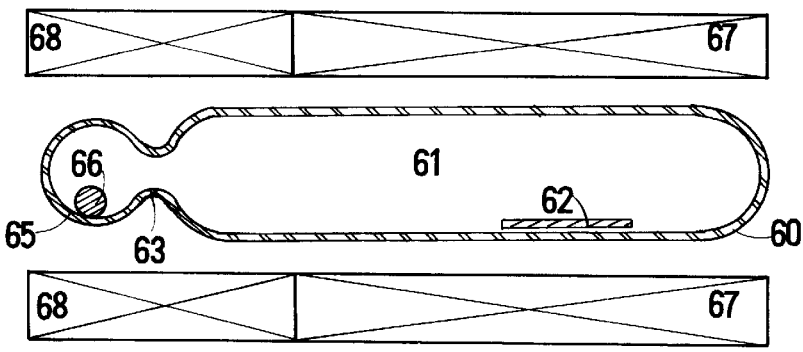
FIG. 14 is a section of an impurity diffusion apparatus of a closed tube method.
Figure 15:
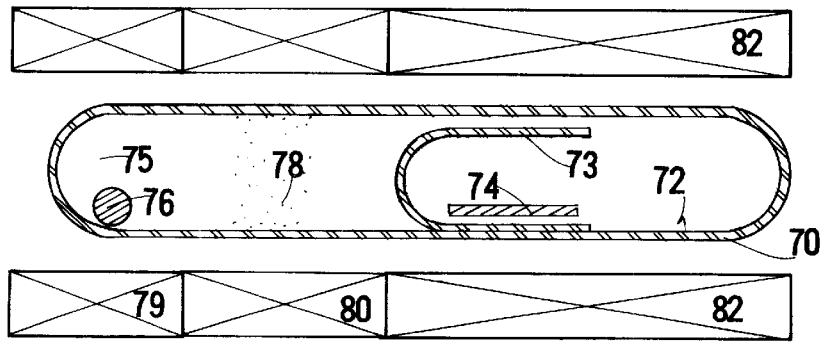
FIG. 15 is a section of an impurity diffusion apparatus of the closed tube method disclosed by Japanese Patent Publication No.2-24369.
Figure 16:
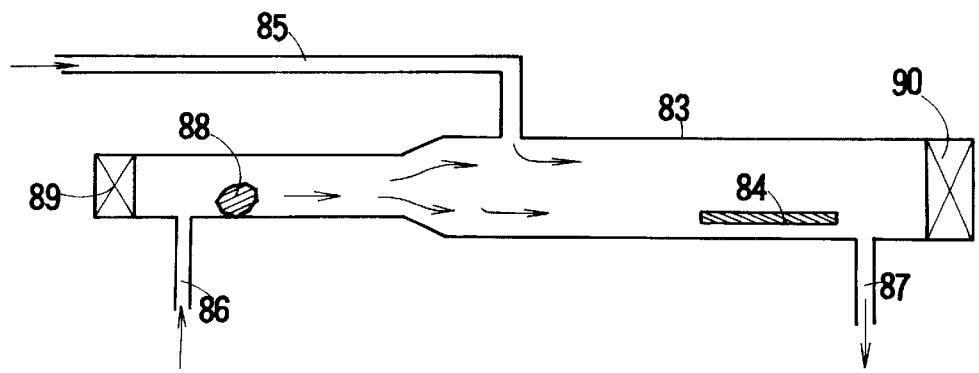
FIG. 16 is a section of an impurity diffusion apparatus of the open tube method disclosed by Japanese Patent Laying Open No.62-143421.

FIG. 13 denotes the temperature profile of the double diffusion of Embodiment 3.

Individual steps are explained;

[Preparatory steps]

(1) An object wafer 14 is put in the cavity 2 on the base plank 1.

(2) The reaction tube (e.g., quartz tube) is installed into the furnace.

(3) The slider 44 is pulled back to a point where the first diffusion room 50 stays above the exhaustion hole 3 by the manipulating bar 49.

(4) The screws 47 are taken off the slider 44. The cap plate 46 is removed from the frame 45. A second diffusion material 11 is supplied on the rack 54 in the second diffusion room 10. A V element material 31 is put on the rack 55 in the middle V element room 30. Like former embodiments, the V element material is red phosphorus for an InP object wafer or arsenic (As) for a GaAs object wafer. A first diffusion material 51 is laid on the rack 56 of the first diffusion room 50.

(5) The capping plate 46 is fixed upon the frame 45 by the screws 47. The end of the manipulating bar 49 is inserted into the end hole 48 of the slider 44.

(6) The whole of the base plank 1 is inserted into the quartz tube 20.

[Step 1 (exhaustion of first diffusion room·V element room·second diffusion room)]

(7) The whole reaction tube is exhausted into a vacuum. The outer space of the slider 44 is evacuated. A vacuum is created also in the first diffusion room 50 through the exhaustion hole 3.

(8) The slider 44 is pushed forward to a spot where the V element room 30 lies upon the exhaustion hole 3. The V element room 30 is exhausted through the exhaustion hole 3.

(9) The slider 44 is further pushed forward to another spot where the second diffusion room 50 lies upon the exhaustion hole 3. The second diffusion room 50 is evacuated through the exhaustion hole 3. Thus, all the rooms 50, 30 and 10 are evacuated into a vacuum. The slider 44 is slightly displaced for isolating the diffusion room 10 from the atmosphere in the reaction tube 20. Three rooms 50, 30 and 10 are isolated. Hydrogen gas is supplied into the reaction tube, which corresponds to the line $\mu\nu$ in FIG. 13.

[Step 2 (step of rising temperature or heating step)]

(10) The slider 44 is carried by the manipulating bar 49 to a spot where the non-doped capping wafer 13 shields the object wafer 14 which is shown in FIG. 11. The furnace heats the whole of the reaction tube including the base plank, the slider 44 and the wafers 14 and 13. This corresponds to the curve $\nu\xi$ in FIG. 13. The capping wafer 13 protects the wafer 14 during the rising temperature step.

[Step 3 (first diffusion step)]

(11) When the temperature rises up to Td (T=Td), the manipulating bar 49 conveys the slider 44 to a spot where the wafer 14 is covered by the first diffusion room 50 which has high vapor pressure of the Zn compound. The wafer 14 adsorbs the dopants (the Zn compound). Zn atoms diffuse from the surface into the object wafer. The diffusion corresponds to the line $\xi o$ in FIG. 13. The diffusion time $t_1$ is predetermined in accordance with the purpose.

[Step 4 (transient cooling)]

(12) When the predetermined diffusion time $t_1$ has elapsed, the slider 44 is further moved to a spot where the V element room 30 shields the object wafer 14. The temperature is decreased from $Td_1$ to $Td_2$ by reducing the heater power. The transitory cooling is denoted by the line $o\pi$ in FIG. 13. At the transitional step between $Td_1$ to $Td_2$, the V element vapor pressure protects the wafer 14 from the degeneration due to the V element dissociation in the V element room 30.

[Step 5 (second diffusion step)]

When the temperature falls to $Td_2$, the slider 44 is moved forward to a spot where the wafer lies under the second diffusion room 10. The high dopant vapor pressure begins the second diffusion immediately in the second diffusion room 10. The Zn diffusion lasts for $t_2$. The diffusion corresponds to the line $\pi\rho$ in FIG. 13.

[Step 6 (cooling step)]

(14) When $t_2$ elapses, the slider 44 is separated from the cavity 2 by the manipulating bar 49. The diffusion stops at once. The temperature of the furnace is decreased along the line $\rho\sigma$ in the temperature profile of FIG. 13.

Embodiment 1 is further explained in more detail. The Zn diffusion is carried out by the slider of M=1 which is shown in FIG. 1, FIG. 2 and FIG. 3. Since M=1, the slider has only the single room 10. The inner space of the slider 4 has a 30 mm width, a 30 mm length and a 20 mm height. The volume of the inner space is 18 cm³. A non-doped InP capping wafer 13 with an inner rugged surface is fitted at the front end of the slider 4. $Zn_3P_2$ (4 mg) is put on the rack 12 of the diffusion room 10. Two different InP wafers ① and ② are allotted for object wafers for surveying the influence of the carrier density.

InP wafer ① . . . Sn doped InP (carrier density: $1\times10^{18}$ cm$^{-3}$)

InP wafer ② . . . non-doped InP (carrier density: $5\times10^{15}$ cm$^{-3}$)

An object wafer is put into the cavity 2. The frame 5 is put on the base plank 1. The capping plate 6 is fixed to the frame 5 by the screws 7. The end of the manipulating bar 9 is coupled into the hole 8 of the slider 4. The base plank 1 is inserted into the quartz tube. The quartz tube is exhausted into a vacuum of $1\times10^{-6}$ Torr. The slider 4 is carried for coinciding the diffusion room 10 with the exhaustion hole 3. A vacuum is created in the diffusion room 10. Hydrogen gas with good heat conduction is introduced into the quartz tube. The quartz tube is installed into the furnace.

The furnace heats the base plank 1, the slider 4, the wafer 14 and so on. The temperature of the object wafer 14 is monitored by the thermocouple 15. When the temperature measured by the thermocouple is stable at 580° C., the slider 4 is pushed forward for sending the diffusion room 10 just above the object wafer 14. The displacement brings the wafer into contact with the $Zn_3P_2$ vapor. Zn atoms are diffused into the object wafer 14 at 580° C. for the determined diffusion time. When the predetermined diffusion time has elapsed, the slider is separated from the wafer 14 by the manipulating bar 9. The diffusion finishes without delay. The wafer 14 is cooled in the state isolated from the diffusion room 10. The present invention is far superior to the closed tube method in the controllability.

The base plank 1 is plucked out from the quartz tube. The object wafer 14 is taken out of the wafer-storing cavity 2. The object wafer is cleaved for revealing the sectional sides. Then, the wafer is etched by an etchant of potassium ferrocyanide ($K_4[Fe(CN)_6]$)+potassium hydroxide (KOH) which has different etching speeds for n-type InP and p-type InP. The diffusion depth is measured by observing the etched sides of the wafer by a microscope.

The diffusion depth is determined by the average length of the Zn invading into the InP crystal. However, the initial electron density is different for various n-type InP crystals. The measured diffusion length depends upon the initial electron density of the n-type InP. The density of Zn atom varies slowly in the direction of thickness. It is difficult to determine the limit of the Zn distribution as the diffusion depth. Then, the line which equalizes the electron density n to the hole density p is defined as a pn-junction. The diffusion depth is defined as the length from the surface to the pn-junction (p=n). If the initial electron density is lower, comparatively lower doping of Zn can make a deeper pn-junction (p=n). If the initial electron density is higher, the same dopant density makes a shallower pn-junction.

Since the InP wafer ① having higher initial electron density of $n=10^{18}$ cm$^{-3}$ the pn-junction is defined as the line on which the Zn density is equal to $10^{18}$ cm$^{-3}$ (p=n).

The wafer ②̄ having lower initial electron density of n=5×10$^{15}$ cm$^{-3}$, since it is not doped with n-type dopant intentionally. The pn-junction is the interface on which the hole density is equal to 5×10$^{15}$ cm$^{-3}$. The diffusion depth is determined as the depth of the pn-junction.

Figure 6:
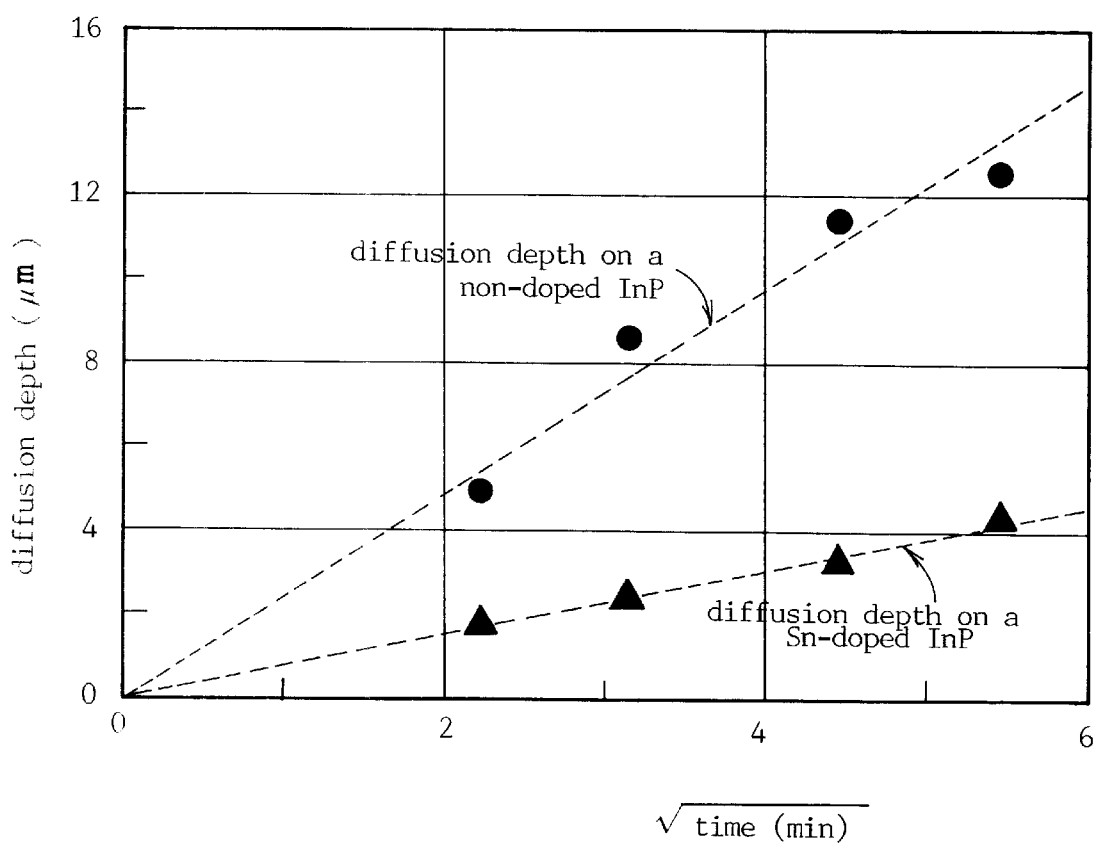
FIG. 6 is a graph showing the relation between the diffusion depth and the root square of diffusion time at 580° C. on non-doped InP wafers and Sn-doped InP wafers.

The diffusion depth is measured for different diffusion times for both the wafers ② and ②̄. FIG. 6 shows the result of the measurement of the diffusion depth. The abscissa is the root of the diffusion time. The ordinate is the measured diffusion depth ($\mu$m). Black rounds denote the diffusion depths of the non-doped InP wafer ②̄. 4 minute diffusion gives about 5 $\mu$m of diffusion depth. 10 minutes of diffusion make about an 8 $\mu$m diffusion depth. A 10 $\mu$m diffusion depth takes about 18 minutes for the non-doped wafer ②̄. The diffusion depth is in proportion to the root of the diffusion time. Black triangles denote the diffusion depths for the Sn-doped n-InP wafer ① with higher initial electron density. 5 minutes of diffision give a 1.8 $\mu$m diffusion depth. 10 minute diffusion makes a 2.3 $\mu$m diffusion depth. 28 minute diffusion obtains a 4.2 $\mu$m depth. The diffusion depth is in proportion to the root of the diffusion time also for the highly doped InP wafer ①. The result shows that the diffusion time exactly controls the diffusion depth. In this invention, the wafer comes into contact to the Zn compound vapor at the beginning of the diffusion step and the wafer is separated from the Zn compound vapor at the cooling step by the operation of the slider. No extra diffusion occurs at the heating step and the cooling step. The control of the start and the stop of diffusion is far more rigorous in the present invention than the closed tube method. The examples use 1-inch diameter wafers. This invention can also apply to wafers of arbitrary sizes.

What we claim is:

1. A method for diffusing Zn into III–V group compound semiconductor crystals comprising the steps of:

preparing a horizontal, elongating base plank having an exhaustion hole and a wafer-storing cavity;

inserting an object group III–V compound wafer into the wafer-storing cavity of the base plank;

preparing a slider consisting of a frame having serially aligning M rooms (M≧1) with an open bottom and a rack being separated from each other by (M−1) partition walls, a non-doped capping wafer affixed at a front end of the frame and a cap plate for covering a top of the frame;

taking the cap plate off the top of the slider;

putting one of a Zn-diffusion source and a V element source turn by turn on each rack of the serially-aligning rooms;

fixing the cap plate on the top of the frame for covering the open top of the slider;

laying the slider on the base plank;

affixing a manipulating bar to the slider;

putting the base plank into a tube;

making an inner space of the tube vacuous;

carrying the slider by the manipulating bar at spots where each room lies in turn just above the exhaustion hole for evacuating each room through the exhaustion hole;

carrying the slider by the manipulating bar to a spot for covering the object wafer with the capping wafer of the slider;

inserting the tube into a furnace with heaters;

heating the base plank, the object wafer and the slider;

moving the slider at a spot for covering the object wafer with the room having the diffusion source when the temperature attains to a pertinent temperature for diffusion;

diffusing the Zn atoms into the object wafer for a determined time at a pertinent temperature in the diffusion source room as a first diffusion process;

moving the slider to a spot for covering the object wafer with the room having the V element source;

changing the temperature of the object wafer to a temperature pertinent to following diffusion by regulating power of the heaters;

moving the slider to a spot for covering the object wafer with the following room having the diffusion source;

diffusing the Zn atoms into the object wafer for a determined time at a pertinent temperature in the diffusion source room as a second diffusion process;

repeating necessary cycles of the steps of changing temperature and the steps of the Zn-diffusion; and finally moving the slider at a spot away from the object wafer for cooling the object wafer in a state separating from the diffusion room of the slider.

2. A method as claimed in claim 1, wherein the slider has a none-doped capping wafer at a rear end for covering the object wafer with the capping wafer during the cooling step for preventing V elements from escaping out of the object wafer.

3. A method as claimed in claim 2, wherein the diffusion material is one of $Zn_3P_2$, $ZnP_2$, $Zn_3P_2+P$, $ZnP_2+P$, $Zn_3As_2$, $ZnAs_2$, $Zn_3As_2+As$, $ZnAs_2+As$.

4. A method as claimed in claim 3, wherein one or more than one of the V element rooms are replaced by non-doped capping wafers.

5. A method for diffusing Zn into III–V group compound semiconductor crystals comprising the steps of:

preparing a horizontal, elongating base plank having an exhaustion hole and a wafer-storing cavity;

inserting an object group III–V compound wafer into the wafer-storing cavity of the base plank;

preparing a slider consisting of a frame having serially aligning M rooms (M>2) with an open bottom and a rack being separated from each other by (M−1) partition walls and a cap plate for covering a top of the frame;

taking the cap plate off the top of the slider;

putting one of a Zn-diffusion source and a V element source turn by turn on each rack of the serially-aligning rooms;

fixing the cap plate on the top of the frame for covering the open top of the slider;

laying the slider on the base plank;

affixing a manipulating bar to the slider;

putting the base plank into a tube;

making an inner space of the tube vacuous;

carrying the slider by the manipulating bar at spots where each room lies in turn just above the exhaustion hole for evacuating each room through the exhaustion hole;

carrying the slider by the manipulating bar to a spot for covering the object wafer with the room having the V element source of the slider;

inserting the tube into a furnace with heaters;

heating the base plank, the object wafer and the slider;

moving the slider at a spot for covering the object wafer with the room having the diffusion source when the temperature attains to a pertinent temperature for diffusion;

diffusing the Zn atoms into the object wafer for a determined time at a pertinent temperature in the diffusion source room as a first diffusion process;

moving the slider to a spot for covering the object wafer with the room having the V element source;

changing the temperature of the object wafer to a temperature pertinent to following diffusion by regulating power of the heaters;

moving the slider to a spot for covering the object wafer with the following room having the diffusion source;

diffusing the Zn atoms into the object wafer for a determined time at a pertinent temperature in the diffusion source room as a second diffusion process;

repeating necessary cycles of the steps of changing temperature and the steps of the Zn-diffusion; and finally moving the slider at a spot away from the object wafer for cooling the object wafer in a state separating from the diffusion room of the slider.

6. A method as claimed in claim 5, wherein the slider has a none-doped capping wafer at a rear end for covering the object wafer with the capping wafer during the cooling step for preventing V elements from escaping out of the object wafer.

7. A method as claimed in claim 6, wherein the diffusion material is one of $Zn_3P_2$, $ZnP_2$, $Zn_3P_2+P$, $ZnP_2+P$, $Zn_3As_2$, $ZnAs_2$, $Zn_3As_2+As$, $ZnAs_2+As$.

8. A method as claimed in claim 7, wherein one or more than one of the V element rooms are replaced by non-doped capping wafers.

* * * * *